US012322916B2

(12) United States Patent
Kapusta et al.

(10) Patent No.: US 12,322,916 B2
(45) Date of Patent: Jun. 3, 2025

(54) ELECTRONIC CONNECTION ASSEMBLY (71) Applicant: GE AVIATION SYSTEMS LLC, Grand Rapids, MI (US)

(72) Inventors: Christopher James Kapusta, Delanson, NY (US); David Richard Esler, Gloversville, NY (US); Arun Virupaksha Gowda, Rexford, NY (US); Brian Magann Rush, Niskayuna, NY (US); Liang Yin, Clifton Park, NY (US); Richard Anthony Eddins, Margate, FL (US); Liqiang Yang, Coral Springs, FL (US); Judd Everett Swanson, Plantation, FL (US)

(73) Assignee: GE AVIATION SYSTEMS LLC, Grand Rapids, MI (US)

( * ) Notice: Subject to any disclaimer, the term of this patent is extended or adjusted under 35 U.S.C. 154(b) by 540 days.

(21) Appl. No.: 17/846,711

(22) Filed: Jun. 22, 2022

(65) Prior Publication Data
US 2023/0420901 A1    Dec. 28, 2023

(51) Int. Cl.
*H05K 7/00* (2006.01)
*H01R 13/52* (2006.01)
*H01R 31/06* (2006.01)
*H01R 33/05* (2006.01)
*H01R 33/88* (2006.01)
*H05K 7/20* (2006.01)
*H01R 13/26* (2006.01)

(52) U.S. Cl.
CPC .......... *H01R 33/88* (2013.01); *H01R 13/521* (2013.01); *H01R 31/065* (2013.01); *H01R 33/05* (2013.01); *H05K 7/20927* (2013.01); *H01R 13/26* (2013.01)

(58) Field of Classification Search
CPC .... H01R 13/521; H01R 31/065; H01R 33/05; H05K 7/20927
See application file for complete search history.

(56) References Cited

U.S. PATENT DOCUMENTS

| 5,057,968 | A  | 10/1991 | Morrison |
| 6,328,605 | B1 | 12/2001 | Walker et al. |
| 7,408,766 | B2 | 8/2008  | Oesterhaus et al. |

(Continued)

FOREIGN PATENT DOCUMENTS

| EP | 2985847 A2 | 2/2016 |
| EP | 3293833 B1 | 11/2019 |

(Continued)

*Primary Examiner* — Phuong Chi Thi Nguyen
(74) *Attorney, Agent, or Firm* — Fitch, Even, Tabin & Flannery LLP (57) ABSTRACT The disclosure relates to an apparatus for connecting an electronic component to a conductor. A housing includes at least one slot and defines at least one component chamber for carrying the electronic component. A liquid coolant can pass through the housing. A pair of conductive members extends from the housing through the at least one slot and can be releasably inserted into a channel defined in a support assembly. The support assembly facilitates an electrical connection between the conductive members and corresponding conductive contact members connected to a respective power supply or electrical load. The support assembly can provide an inward sealing force to a seal on the housing circumscribing the pair of conductive members.

20 Claims, 6 Drawing Sheets (56) References Cited

U.S. PATENT DOCUMENTS

| | | | |
|---|---|---|---|
| 7,697,292 B2 * | 4/2010 | Uluc | H05K 7/20645 |
| | | | 165/104.34 |
| 8,208,238 B1 * | 6/2012 | Mcleod | G11B 5/852 |
| | | | 361/143 |
| 8,358,000 B2 * | 1/2013 | Beaupre | H01L 23/3735 |
| | | | 257/691 |
| 8,653,635 B2 * | 2/2014 | Gowda | H01L 23/49575 |
| | | | 257/E27.155 |
| 9,142,484 B2 * | 9/2015 | Delgado | H01L 23/473 |
| 9,337,163 B2 * | 5/2016 | Delgado | H01L 24/19 |
| 9,437,523 B2 * | 9/2016 | Joshi | H01L 23/4735 |
| 9,548,552 B2 | 1/2017 | Aboulkassem et al. | |
| 9,706,788 B2 * | 7/2017 | Segall | A23J 3/16 |
| 9,736,967 B2 * | 8/2017 | Molitor | H05K 7/20218 |
| 10,177,676 B2 | 1/2019 | Tokuyama et al. | |
| 10,763,190 B2 | 9/2020 | Tsuyuno et al. | |
| 2008/0111322 A1 * | 5/2008 | Otsubo | F16L 55/1108 |
| | | | 277/654 |
| 2009/0067122 A1 | 3/2009 | Darr | |
| 2020/0205319 A1 | 6/2020 | Pouilly et al. | |

FOREIGN PATENT DOCUMENTS

| | | |
|---|---|---|
| JP | 2006136189 A | 5/2006 |
| JP | 2012151005 A | 8/2012 |
| JP | 2012249501 A | 12/2012 |
| JP | 5299146 B2 | 9/2013 |
| JP | 2014036520 A | 2/2014 |
| JP | 2015026667 A | 2/2015 |
| JP | 2015133368 A | 7/2015 |
| JP | 2017022835 A | 1/2017 |
| WO | 2015097833 A1 | 7/2015 |

* cited by examiner

ELECTRONIC CONNECTION ASSEMBLY

STATEMENT REGARDING FEDERALLY SPONSORED RESEARCH OR DEVELOPMENT

This invention was made with government support under Contract No. W911NF1820101 awarded by the United States Government. The government has certain rights in the invention.

TECHNICAL FIELD

The disclosure generally relates to electronic assemblies, and more specifically toward a housing with structures for an insertable interconnection arrangement and conductor support for power module components.

BACKGROUND

Conventional power systems manage the supply of electrical power from power sources, such as generators, to electrical loads. In one example, gas turbine engines are used for propulsion of aircraft, and typically provide mechanical power which ultimately powers a number of different accessories such as generators, starter/generators, permanent magnet alternators (PMA), fuel pumps, and hydraulic pumps, e.g., equipment for functions needed on an aircraft other than propulsion. For example, contemporary aircraft need electrical power for avionics, motors, and other electric equipment. A generator coupled with a gas turbine engine converts the mechanical power of the engine into electrical energy, which is distributed throughout the aircraft by electrically-coupled nodes of the power distribution system.

The growing demand for power electronic devices to manage high power densities in such power systems has led to the development of the power electronic module or power module. The power module is an assembly typically including several power components, such as power semiconductor devices interconnected to perform a power conversion function. Power modules are used in power conversion equipment such as industrial motor drives, uninterruptible power supplies, and inverters. Power modules provide the packaging or physical containment for a set of power semiconductor components. The power semiconductors (or "dies") are typically soldered or sintered onto a power electronic substrate that supports the power semiconductors, provides electrical and thermal contact and electrical insulation where needed. More recently, power modules increasingly employ a power overlay (POL) module type packaging and interconnect system. Such POL modules use multiple layers of conductive and insulative materials to support the power semiconductor devices, provide electrical interconnections between the semiconductor devices and external circuits, and manage heat generated during normal operation.

BRIEF DESCRIPTION OF THE DRAWINGS

A full and enabling disclosure, including the best mode thereof, directed to one of ordinary skill in the art, is set forth in the specification, which refers to the appended figures in which.

DETAILED DESCRIPTION

Aspects of the present disclosure are directed to a connection for an electrical component and method of cooling. For the purposes of illustration, the present disclosure will be described in one exemplary environment of an aircraft power system. It will be understood that aspects of the disclosure can have general applicability to any power system, as well as in non-aircraft applications, such as other mobile applications and non-mobile industrial, commercial, and residential applications.

Typical power electronics device chips are generally interconnected with fragile wire or ribbon bonding that extends above the device surface on one side and restricts the main heat extraction path from the chips to the other side of the device. Conventional wire or ribbon bonded devices do not allow for easy double-sided cooling or stacking of the power modules. This results in two-dimensional or planar "tiled" device configurations that attach to a separate planar cold plate. Such cold plates have additional thermal resistances in the heat transfer path and have lower thermal performance relative to direct contact forced convection on the device itself.

In addition, cooling fluid performance varies for different types of fluids. Electrically insulating cooling fluids (e.g. oil) generally have lower thermal performance for a given pumping power compared to other, less-insulative cooling fluids (e.g. water) for direct contact cooling.

Some prior art power electronic devices and systems employ cooling by direct liquid impingement on multiple sides of the device. For example, electronic components such as power overlay (POL) packaging and interconnect device modules ("tiles") are fabricated with a wirebondless configuration that results in a compact, planar form factor. Such POL modules can be inserted into a housing that provides direct contact or impingement jets of cooling liquid located directly adjacent portions of the POL modules requiring cooling, such as silicon carbide (SiC) chips, bus bars, or the like. Such housings require leak-tight feedthroughs into which the POL modules can be inserted and electrical connections made to other devices.

While the various aspects of a POL module disclosed herein are described and depicted as including a particular arrangement of semiconductor devices, electrical interconnections, and electronic package terminals, it is understood that alternative arrangements and configurations could also be implemented and thus aspects are not limited only to the specifically illustrated devices and arrangements thereof. That is, aspects described herein should also be understood to encompass electronics packages that can include additional electronic components and can additionally or alternatively include one or more alternative device types of semiconductor devices including acoustic devices, microwave devices, millimeter devices, RF communication devices, and micro-mechanical (MEMS) devices.

It is contemplated that aspects of the POL modules and modular devices as disclosed herein can comprise a semiconductor device module or power module providing interconnection and physical support or containment for one or more semiconductor devices defining a topology. Aspects described herein can also include one or more resistors, capacitors, inductors, filters, switches and similar devices and combinations thereof. As used herein the terms "electrical component" and "electronic component" can be understood to encompass any of the various types of semiconductor devices described above as well as resistors, capacitors, inductors, filters and similar passive devices, and energy storage components.

A conventional POL module provides physical support for the power components, including power semiconductor devices. These power semiconductors, or dies, are typically soldered or sintered on a power electronic substrate that supports the power semiconductors, and provides electrical and thermal contact and electrical insulation, thereby enabling a higher power density than discrete power components. One notable feature of conventional POL component architecture is a planar copper interconnection structure. Instead of conventional wire bonds, devices in a typical POL interconnection arrangement connect directly to device connection pads by way of vias formed through an insulative polyimide adhesive layer, with passive elements (e.g. resistors, capacitors, and inductors) installed or built-up as needed.

A conventional POL module manufacturing process typically begins with placement of one or more power semiconductor devices onto a dielectric layer by way of an adhesive. Metal interconnects (e.g., copper interconnects) are then electroplated onto the dielectric layer to form a direct metallic connection to the power semiconductor device(s) by way of the vias defined through the dielectric layer. The metal interconnects provide for the formation of an input/output (I/O) system to and from the power semiconductor device(s). The POL component is then soldered to an insulated metal substrate (for example, a direct bond copper (DBC) substrate) using soldered interconnections for electrical and thermal connectivity. Gaps around the semiconductor devices between the dielectric layer and the ceramic substrate can be filled using a dielectric organic material.

The insulated metal substrates often consist of three layers, i.e., a metal top layer and metal bottom layer with a ceramic insulating layer sandwiched in between. The insulating layer of the insulated metal substrate electrically insulates the metal top layer from the metal bottom layer. The metal layers are either directly bonded or brazed to the ceramic layer. The metal insulated substrate typically can be soldered on an opposite side (e.g., a bottom side) to a baseplate. In many cases, the baseplate is formed of copper and attached to the bottom metal layer of the metal insulated substrate using solder. The baseplate is typically often mounted to a conventional heat sink. The conventional metal insulated substrate is commonly used in POL modules, due to their thermal conductivity and rigidity, to support the semiconductor devices while simultaneously providing an electrical interconnect structure. The rigidity of the baseplate provides additional structural support for the POL module. The insulating layer (middle) portion of the metal insulated substrate can also provide electrical isolation between the semiconductor devices and a heatsink or chassis.

Conventional POL modules are often used in electrical power converters, such as in AC drives and flexible AC transmission systems. A power converter is a power supply or power processing circuit that converts an input voltage waveform into a specified output voltage waveform. Controllers associated with the power converters manage an operation thereof by selectively controlling the conduction periods of switches employed therein. The switches employed by the power converter are typically semiconductor switching devices (e.g., MOSFETs, IGBTs, etc.).

In combination with the controller, a drive circuit (for example, a gate drive circuit) is conventionally employed to selectively provide a drive signal to a control terminal (e.g., a gate terminal) of each semiconductor switch to control an operation thereof in response to a command signal (for example, a pulse-width modulated (PWM) signal) from the controller.

It should be understood that for ease of description and understanding, the accompanying drawings are not necessarily drawn to scale, and may be depicted schematically. For example, certain elements in the drawings may be larger or smaller than illustrated, relative to other elements depicted in the drawings.

All directional references (e.g., radial, axial, upper, lower, upward, downward, left, right, lateral, front, back, top, bottom, above, below, vertical, horizontal, clockwise, counterclockwise) are only used for identification purposes to aid the reader's understanding of the disclosure, and do not create limitations, particularly as to the position, orientation, or use thereof. Connection references (e.g., attached, coupled, connected, and joined) are to be construed broadly and can include intermediate members between a collection of elements and relative movement between elements unless otherwise indicated. As such, connection references do not necessarily infer that two elements are directly connected and in fixed relation to each other. In non-limiting examples, connections or disconnections can be selectively configured to provide, enable, disable, or the like, an electrical connection between respective elements.

While "a set of" various elements will be described, it will be understood that "a set" can include any number of the respective elements, including only one element. Additionally, while terms such as "voltage," "current," and "power" can be used herein, it will be evident to one skilled in the art that these terms can be interchangeable when describing aspects of an electrical circuit or circuit operations.

The disclosure can be implemented in any electrical circuit environment. One non-limiting example of an electrical circuit environment that can include aspects of the disclosure can include an aircraft power system architecture, which enables production of electrical power from at least one spool of a turbine engine, such as a gas turbine engine, and delivers the electrical power to a set of electrical loads via at least one solid state switch, such as a solid-state power controller (SSPC) switching device. One non-limiting example of the SSPC can include metal-oxide-semiconductor field-effect transistor (MOSFET), such as a silicon carbide (SiC) or Gallium Nitride (GaN) based, high power switch. SiC or GaN can be selected based on their solid-state material construction, their ability to handle high voltages and large power levels in smaller and lighter form factors, and their high-speed switching ability. Additional switching devices or additional silicon-based power switches can be included.

The exemplary drawings are for purposes of illustration only and the dimensions, positions, order and relative sizes reflected in the drawings attached hereto can vary.

Figure 1:
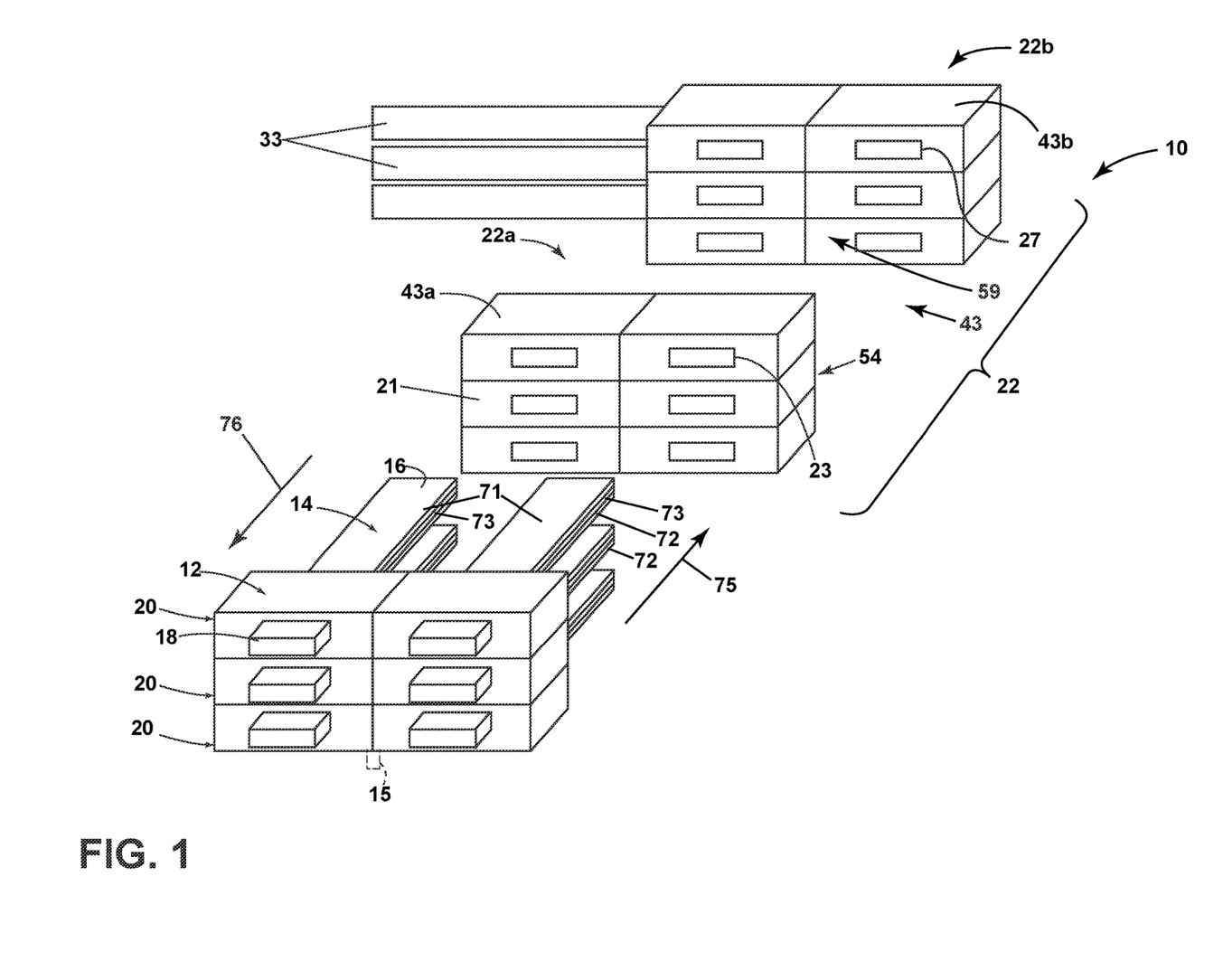
FIG. 1 is a schematic perspective view of a connection assembly for an electronic component in accordance with various aspects described herein.

FIG. 1 is a partially exploded simplified schematic view of an exemplary connection assembly 10 (hereafter "connection assembly 10") for an electronic component in accordance with various aspects described herein. The connection assembly 10 enables electrical connection between the electronic component 14 and external conductors or electrical circuits. While the electronic component 14 will be described herein in the exemplary form of a conventional power overlay POL module 14, for ease of description and understanding, other aspects of the disclosure are not so limited. In other non-limiting aspects, the electronic component 14 can be any suitable electronic component, including a printed circuit board (PCB) card or a PCB module without departing from the scope of the disclosure herein.

The connection assembly 10 can include a set of housings 12 couplable to a support assembly 22. The set of housings 12 can be coupled together to form a unitary body or housing 12. Each of the housings 12 can carry a corresponding POL module 14. Each POL module 14 can extend from a respective first end 16 (e.g., an output end) to a respective second end 18 (e.g., an input end). The POL modules 14 can be positioned partially within an interior of a corresponding housing 12 with the respective first end 16 extending therefrom via an aperture (not visible in FIG. 1). In non-limiting aspects, the first end 16 can define a conductive member portion 70 extending from the housing 12, while the second end 18 can define an electrical devices portion 69 (not visible in FIG. 1) received within the housing 12. The conductive member portion 70 can comprise a first conductive member 71 and a second conductive member 72. For example, in some aspects, the first and second conductive members 71, 72 can be a rigid electrically conductive bus bar or blade. In non-limiting aspects, an electrically insulating layer 73 can be disposed between the first and second conductive members 71, 72. The electrically insulating layer 73 can electrically insulate the first conductive member 71 from the second conductive member 72. In this way, in non-limiting aspects, the conductive member portion 70 can define a substrate, wherein the first conductive member 71 is a first layer of the substrate, the second conductive member 72 is a second layer of the substrate, and the first conductive member 71 and the second conductive member 72 are separated by the insulating layer 73 of the substrate.

In non-limiting aspects, the support assembly 22 can comprise an insulative base 43. In some aspects, the insulative base 43 can comprise a first insulative base 43a, and a second insulative base 43b. The first insulative base 43a can be coupleable to the second insulative base 43b. The support assembly 22 can define an input portion 22a and an output portion 22b. The input portion 22a can be disposed between the set of housings 12 and the output portion 22b. For example, in non-limiting aspects, the input portion 22a can include the first insulative base 43a, and the output portion 22b can include the second insulative base 43b. The first insulative base 43a can comprise a housing interface surface 21 arranged to face the set of housings 12, and an opposing first interface surface 54 arranged to face the output portion 22b. The second insulative base 43b can comprise a second interface surface 59 arranged to face the input portion 22a. It will be appreciated that while FIG. 1 depicts the input portion 22a and output portion 22b as comprising separate structures (i.e., first insulative base 43a and second insulative base 43b), in other non-limiting aspects, the input portion 22a and output portion 22b can be formed as a unitary structure or base 43. In such aspects, the first interface surface 54 can be omitted.

The input portion 22a of the support assembly 22 can define a set of first input apertures 23. Each first input aperture 23 can correspond to a respective first conductive member 71, second conductive member 72, or both, and be sized and disposed to insertably receive the respective first conductive member 71, second conductive member 72, or both, therethrough. Additionally, the input portion 22a can define a set of first output apertures (not shown) corresponding to a respective first input aperture 23. Each first output aperture can also correspond to a first conductive member 71, second conductive member 72, or both and be sized to insertably receive the respective first conductive member 71 second conductive member 72, or both therethrough. In non-limiting aspects, the output portion 22b of the support assembly 22 can define a set of second input apertures 27. Each second input aperture 27 can correspond to a respective first conductive member 71 second conductive member 72, or both, and be sized and disposed to insertably receive the respective first conductive member 71, second conductive member 72, or both therethrough.

In operation, the set of housings 12 can be moved in a first direction 75 to thereby insert the respective first conductive members 71 and second conductive member 72 extending therefrom through corresponding first input apertures 23, through the input portion 22a, through corresponding second input apertures 27, and into the output portion 22b. In this way, each first conductive member 71, and second conductive member 72 can be operatively inserted into the support assembly 22 and electrically coupled to corresponding conductors (not shown) disposed therein. In non-limiting aspects, the corresponding conductors can also be fixedly electrically coupled to a respective AC output conductor 33, such as an output bus bar, terminal, conductor, or lug of an external circuit or device, disposed at an exterior of the output portion 22b. Additionally, corresponding conductors can alternatively be electrically coupled to a respective conductive DC input member (not shown), such as an input bus bar, terminal, conductor, or lug of an external circuit or device, disposed at an exterior of the output portion 22b.

In non-limiting aspects, the connection assembly 10 can be in the form of a modular assembly. In the example shown, one housing 12 and one POL module 14 can collectively define a modular unit 20. Additionally, or alternatively, a modular unit 20 can be defined by a single housing 12 receiving multiple POL modules 14. Each modular unit 20 can be fastened, stacked, or otherwise coupled together to extend in at least two directions, such as horizontally and vertically in a non-limiting example. In this manner, the connection assembly 10 can have multiple modular units coupled together and arranged along multiple directions to form a multi-dimensional assembly with increased power density for meeting power demands.

In one non-limiting example, the connection assembly 10 can include one or more fluid couplings 15 (illustrated schematically in dashed line). Such fluid couplings 15 can provide a fluid inlet to a modular unit 20, a fluid outlet to a modular unit 20, or a fluid coupling between two modular units 20, in non-limiting examples.

In operation, power or communication signals, such as gate drive signals can be provided to the POL module 14 via a pinout connector (not shown) electrically coupled to the POL module 14 at the second end 18. In non-limiting aspects, the POL module 14 can be provided with a DC electrical input and can provide an AC electrical output. For example, in operation, the POL modules 14 can be supplied with DC electrical power via one of the first conductive member 71 or the second conductive member 72 at the first end 16, for example via a battery, DC-DC converter, or other power source (not shown). The POL modules 14 can be configured to convert the DC electrical power to AC power in a known manner. The POL modules 14 can switchably deliver the AC power to connected devices (not shown) via the other of the first conductive member 71 or second conductive member 72 at the first end 16. In this way, in non-limiting aspects, DC electrical power can be provided via a DC bus member to one of the first conductive member 71 or second conductive member 72 of a respective POL module 14, and AC electrical power can be delivered from the respective POL module 14, through the other of the first conductive member 71 or second conductive member 72, to a respective AC output conductor 33, and then to a connected electrical circuit (not shown).

Figure 2:
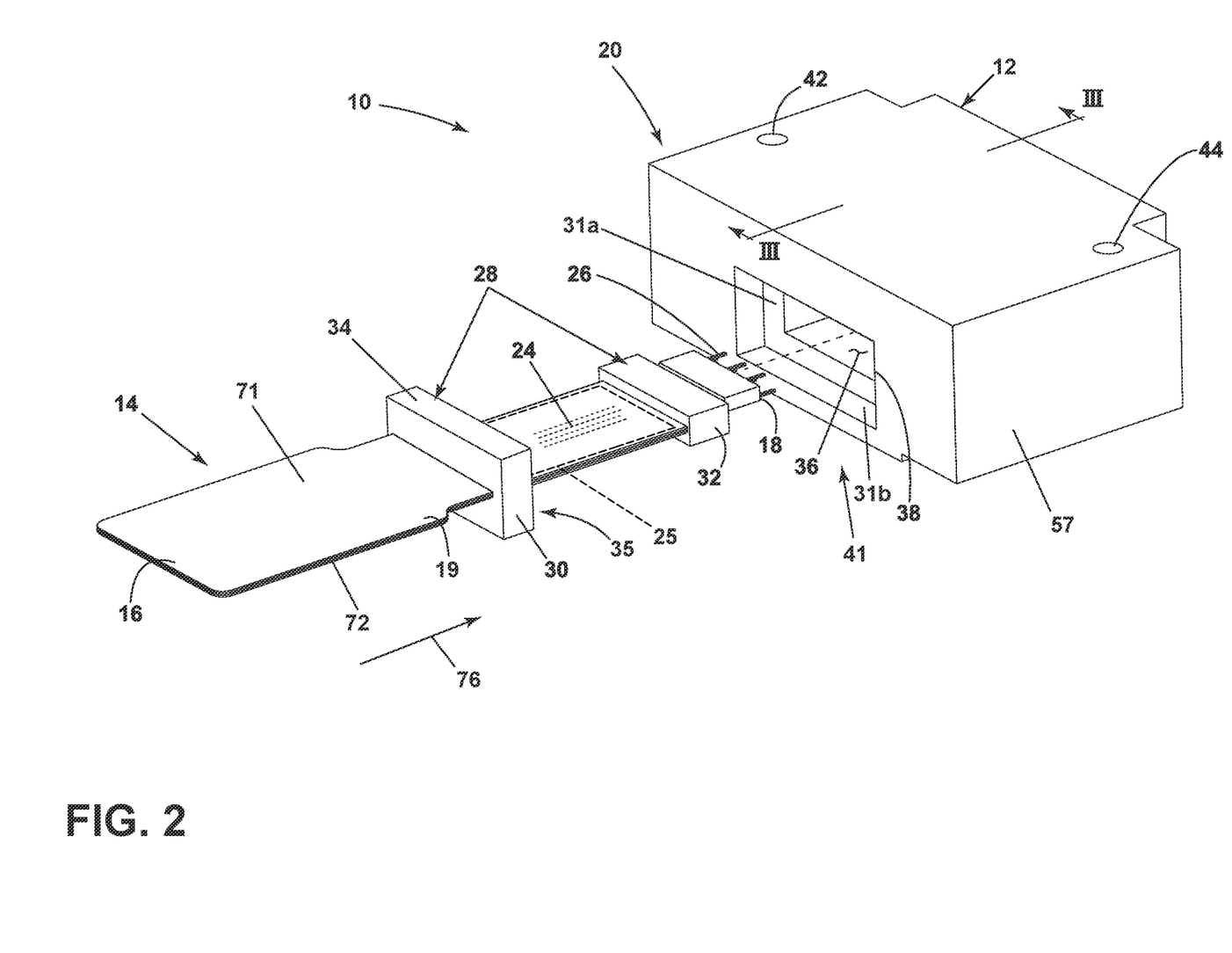
FIG. 2 is a schematic perspective view of another connection assembly for an electronic component in accordance with various aspects described herein.

FIG. 2, illustrates an exemplary modular unit 20 with a housing 12 and a POL module 14 that can be utilized in non-limiting aspects of the connection assembly 10, is illustrated. The POL module can support a set of electrical devices 24 thereon. The housing 12 includes an outer wall 57 bounding an interior portion 36. The outer wall 57 can thus also define an exterior portion 41. In some aspects, the housing can include at least one fluid inlet 42 and a fluid outlet 44. At least one insertion aperture in the form of a first slot 38 extends through the outer wall 57 to the interior portion 36. In one aspect, the first slot 38 can extend from the exterior portion 41 through the outer wall 57 to the interior portion 36. The POL module 14 can be inserted into the housing 12 through the first slot 38 as shown.

In non-limiting aspects, the housing 12 can define a first sealing surface 31*a* surrounding the first slot 38. Additionally, or alternatively, the housing 12 can define a second sealing surface 31*b* surrounding the first slot 38. In non-limiting aspects, the first sealing surface 31*a* and second sealing surface 31*b* can be arranged orthogonal to each other.

In non-limiting aspects, conductive member portion 70 can protrude from the housing 12. For example, the first conductive member 71 and the second conductive member 72 extend from the first slot 38 with an insulating layer 73 disposed between the first and second conductive members 71, 72. In non-limiting aspects, the electrical devices portion 69 can be received within the interior portion 36. The POL module second end 18 can optionally protrude from an opposing side of the housing 12. As illustrated, the second end 18 can include a pinout connector 26 for connection to other electrical devices as needed.

Optionally, an insulating or dielectric coating 25 can be provided on any portion of the POL module 14, including over the set of electrical devices 24, or over the entire POL module 14. Such a coating 25 can include any suitable insulating material, including silicone or parylene in non-limiting examples.

A set of sealing elements 28 can be provided in the connection assembly 10. In non-limiting aspects, the set of sealing elements 28 can include a first seal 30 and a second seal 32. The first seal 30 can be disposed proximate the first end 16 and a second seal 32 can be disposed proximate the second end 18, as shown. In the example shown, first seal 30 is coupled to the POL module 14. For example, the first seal 30 can engageably surround or circumscribe a portion of the POL module 14 to form a seal therebetween. Additionally, or alternatively, the sealing elements 28 can be coupled to either or both of the housing 12 or the POL module 14. For example, the first seal 30 can include a sealing element first surface and a sealing element second surface 34. In the example shown in FIG. 2, the sealing element first surface 35 can be arranged to sealingly engage the first sealing surface 31*a*, and the sealing element second surface 34 can be arranged to sealingly engage the second sealing surface 31*b*.

The sealing elements 28 can be formed of any suitable material including, but not limited to, rubber, silicone, dielectric materials, polymeric materials, composite materials, or fiberglass materials, or the like, or combinations thereof. In addition, while illustrated as including a pair of seals, the set of sealing elements 28 can include any number of seals, including only one, or three or more. In another non-limiting example, the sealing element 28 can be formed as a unitary body coupled to the POL module 14 at multiple locations, such as a U-shaped sealing body coupled to the POL module 14 at distal ends thereof. Still further, while the sealing elements 28 are illustrated as a generally rectangular toroidal element, this is merely for the purposes of visual clarity and the design, size, or shape of the sealing elements 28 are not limited thereto. The sealing elements 28 can have any suitable geometric profile, as well as other components including locking mechanisms, fasteners, or the like, as is known in the art. Any suitable manufacturing method or process can be utilized in forming the connection assembly 10, including casting, machining, or additive manufacturing.

As used herein, "additive manufacturing" (AM) will refer to a process wherein the component is built layer-by-layer by successive deposition of material. AM is an appropriate name to describe the technologies that build three-dimensional (3D) objects by adding layer-upon-layer of material, whether the material is plastic or metal. AM technologies can utilize a computer, 3D modeling software (Computer Aided Design or CAD), machine equipment, and layering material. Once a CAD sketch is produced, the AM equipment can read in data from the CAD file and lay down or add successive layers of liquid, powder, sheet material or other material, in a layer-upon-layer fashion to fabricate a 3D object. It should be understood that the term "additive manufacturing" encompasses many technologies including subsets like 3D Printing, Rapid Prototyping (RP), Direct Digital Manufacturing (DDM), layered manufacturing, and additive fabrication. Non-limiting examples of additive manufacturing that can be utilized to form an additively-manufactured component include powder bed fusion, vat photopolymerization, binder jetting, material extrusion, directed energy deposition, material jetting, or sheet lamination.

Figure 3:
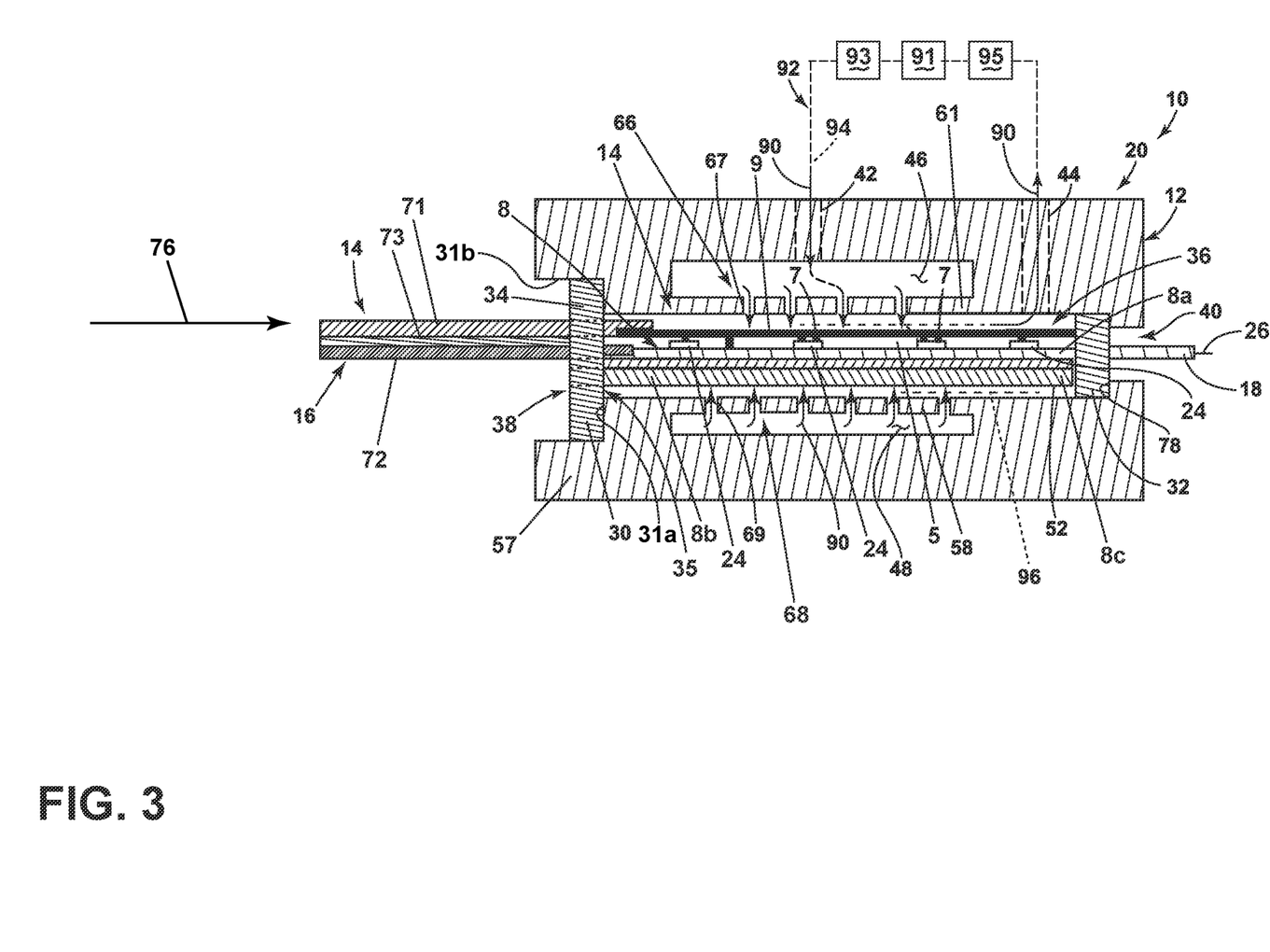
FIG. 3 is a schematic cross-sectional depiction of the connection assembly of FIG. 2 along the line III-III.

FIG. 3 illustrates a schematic sectional view of the housing 12 with the POL module 14 installed into the housing 12. For visual clarity, the coating 25 is not illustrated in FIG. 3. It will be understood that any portion of the POL module 14 can include the coating 25.

The housing 12 can include a second slot 40 through the outer wall 57 extending to the interior portion 36. In the illustrated example, the second slot 40 is in registry with the first slot 38 though this need not be the case. The first end 16 of the POL module 14 is positioned adjacent the first slot 38. The second end 18 of the POL module 14 is positioned adjacent the second slot In this manner, the second end 18 can be received by or extend through the second slot 40, for example via a movement of the POL module 14 in a second direction 76. The second end 18 can extend from the housing 12 to provide for external access to the pinout connector 26. In another example, the second end 18 can remain within the housing 12 when the POL module 14 is inserted through the first slot 38, with no second slot 40 required.

The POL module 14 can include an electrically conductive substrate 8. The POL module 14 can further include a top electrically conductive layer 9 (e.g., a metallized layer) disposed upon a first side (e.g. the top side in Figure) of an electrically insulative or non-conductive dielectric layer 5. The top conductive layer 9 can include or define a set of conductive traces (not shown). The dielectric layer 5 can comprise a second side (e.g., the bottom side in Figure) opposing the first side. The dielectric layer 5 can define a set of apertures (not shown) therethrough, extending from the first side to the second side. In aspects, the top conductive layer 9 can extend through the apertures to define a set of vias 7 through the dielectric layer 5. A set of electrical devices 24 can be disposed on the second side of the dielectric layer 5. As shown, the POL module 14 can define a substantially planar arrangement of the set of electrical devices 24 arranged on the dielectric layer 5 and defining a first planar footprint. The top conductive layer 9 can be electrically coupled with the set of electrical devices 24. For example, in some aspects, the top conductive layer 9 can be electrically connected with the set of electrical devices 24 by way of the set of vias 7 defined through the dielectric layer 5. In non-limiting aspects, the first conductive member 71 can be at least partially disposed within the housing 12, and electrically coupled with the top conductive layer 9. The second conductive member 72 can be partially disposed in the housing 12 and electrically coupled with the electrically conductive substrate 8.

The set of electrical devices 24 can include for example, semiconductor switching devices 24 such as MOSFET type switches. It will be appreciated that in such aspects, each of the semiconductor switching devices 24 can include respective gate ("G"), source ("S"), and drain ("D") terminals (not shown). In non-limiting aspects, the semiconductor switching devices 24 can include a first side (e.g., the top side in Figure), and an opposing second side (e.g., the bottom side in Figure). In non-limiting aspects, the gate terminal G and drain terminal D of the semiconductor switches can be disposed on opposing sides of the respective semiconductor switching device 24. In non-limiting aspects, the source terminal S and gate terminal G can be disposed on a respective semiconductor switching device 24 first side, and the drain terminal D can be disposed on the opposing second side of the respective semiconductor switching device 24. For example, in some aspects, the top conductive layer 9 of the POL module 14 can be electrically coupled with the set of semiconductor switches (e.g., to the source terminal S and gate terminal G) by way of the conductive vias.

In non-limiting aspects, the electrically conductive substrate 8 can comprise an insulated metal substrate, such as a conventional DBC substrate. The electrically conductive substrate 8 can define an electrically conductive first layer 8a (e.g., a top layer) and an opposing electrically conductive second layer 8b (e.g., a bottom layer). The first and second layers 8a, 8b of the electrically conductive substrate 8 can be formed of an electrically conductive material (e.g., copper). An electrically insulative layer 8c can be disposed between the first and second layers 8a, 8b of the electrically conductive substrate 8 to electrically insulate the first layer 8a from the second layer 8b. The first layer 8a can be electrically coupled (e.g., soldered) to the set of electrical devices 24. For example, in non-limiting aspects, first layer 8a can be electrically coupled to the respective drain terminals D of one or more of the semiconductor switches. In non-limiting aspects, the first layer 8a of the electrically conductive substrate 8 can be electrically coupled to the top conductive layer 9 by way of the vias 7. The electrically conductive substrate 8 can be arranged to support the electrical devices 24 while simultaneously providing an electrical interconnection structure. In non-limiting aspects, the electrically conductive substrate 8 can extend from the first end 16 of the housing 12. Furthermore, as illustrated, the first layer 8a can provide a connection surface to electrically couple the second conductive member 72 to the electrically conductive substrate 8.

The set of electrical devices 24 can include solid state switching devices, gate devices configured to operate the gates of the respective solid-state switching devices, rectifying components such as diodes, power storage devices such as batteries, or the like, or any combination thereof. For example, the set of electrical devices 24 can further include a set of gate driver devices (e.g., MOSFET gate driver devices) electrically coupled to the semiconductor switches, configured to selectively operate the respective gates of the semiconductor switches, for example by providing a gate drive signal (not shown) thereto, in a known manner.

It is further contemplated that the housing 12 can provide for liquid impingement cooling of the POL module 14. More specifically, the outer wall 57 of the housing 12 can define at least one fluid inlet 42 and a fluid outlet 44. Multiple fluid inlets 42 and multiple fluid outlets 44 can be provided, though this need not be the case. A first fluid channel 46 and a second fluid channel 48 can be located within the housing 12 and fluidly couple to the at least one fluid inlet 42.

A component chamber 52 in the form of an impingement chamber can be positioned between the first fluid channel 46 and second fluid channel 48 and be fluidly coupled to the fluid outlet 44. A first interior wall 61 divides the first fluid channel 46 from the component chamber 52. A second interior wall 58 divides the second fluid channel 48 from the component chamber 52. In this manner, the first interior wall 61 can form a first side of the component chamber 52, and the second interior wall 58 can form a second side of the component chamber 52.

A first impingement sprayer 66 and a second impingement sprayer 68 direct an impingement flow onto the POL module 14. The impingement sprayers can be located on opposite sides of the POL module 14 or on opposite sides of the component chamber 52. As illustrated, one possible implementation is to incorporate the first and second impingement sprayers 66, 68 into the respective first interior wall 61 and second interior wall 58. In the example shown, the first impingement sprayer 66 is in the form of a first set of impingement holes 67 extending through the first interior wall 61, and the second impingement sprayer 68 is in the form of a second set of impingement holes 69 extending through the second interior wall 58. The first and second impingement sprayers 66, 68 can have any suitable form, including circular holes, rectangular slots, jet nozzles, showerhead nozzles, or the like, in non-limiting examples. In another non-limiting example, either or both of the first and second impingement sprayers 66, 68 can include a sprayer body or nozzle coupled to a liquid supply line. Either or both of the first impingement sprayer 66 or the second impingement sprayer 68 can also fluidly couple the respective first fluid channel 46 and second fluid channel 48 to the central component chamber 52 as shown. In this manner, the first interior wall 61 and the second interior wall 58 can at least partially define the component chamber 52.

Any number of impingement sprayers can be provided. In addition, any number of impingement holes can be provided in the first set of impingement holes 67 and the second set of impingement holes 69. In the example shown, the first set of impingement holes 67 contains fewer impingement holes than the second set of impingement holes 69 though this need not be the case. For example, the POL module 14 can have discrete or localized heated regions or "hot spots" during operation. In such a case, a cluster of impingement sprayers or holes can be positioned adjacent to or confronting such regions to provide for localized impingement cooling. The number and positioning of impingement sprayers can be tailored to the power overlay module for improved cooling and efficiency. Furthermore, the relative size, positioning, and arrangement of impingement sprayers can be adjusted or tailored based on a rate of fluid flow through the liquid supply line. In one non-limiting example, the supply line and impingement sprayers can be configured to provide a fluid velocity or jet velocity through the impingement sprayers of between 0.1 m/s and 1 m/s, or between 1 m/s and 3 m/s, or greater than 3 m/s.

When the POL module 14 is inserted, for example by moving the POL module 14 in the second direction 76, into the component chamber 52, the seals 30, 32 can abut or contact a corresponding interior surface of the housing 12. In non-limiting aspects, the second direction 76 can be opposite to the first direction 75. In the illustrated example, the first seal 30 abuts the first sealing surface 31*a* adjacent the first slot 38, and the second seal 32 abuts a second surface 78 adjacent the second slot 40 though this need not be the case. The sealing element 28 can provide for fluid sealing of the component chamber 52 and prevent leakage through the first first slot 38 or second slot 40. In this manner, the first interior wall 61, the second interior wall 58, and the seals 30, 32 (the sealing element 28) can at least partially define the component chamber 52.

With general reference to FIGS. 1-3, during operation, heat can be generated by the set of electrical devices 24 on the POL module 14. Liquid coolant 90 such as water, water-ethylene glycol, oil, or dielectric fluid can flow into the housing 12 by the at least one fluid inlet 42. In a non-limiting example where the POL module 14 includes the dielectric coating 25, water can be used for the liquid coolant 90 while maintaining electrical insulation of components in the POL module 14.

More specifically, the liquid coolant 90 can enter the first fluid channel 46 and second fluid channel 48, flow through the first and second impingement sprayers 66, 68, and impinge upon opposing sides of the POL module 14 within the component chamber 52 before exiting the housing 12 through the fluid outlet 44. In this manner, a liquid coolant circuit 92 can pass through the housing 12 from the at least one fluid inlet 42, to at least one of the first fluid channel 46 or the second fluid channel 48, to at least one of the first impingement sprayer 66 or the second impingement sprayer 68, to the component chamber 52, and to the fluid outlet 44. A supply line 94 can be at least partially defined by the at least one fluid inlet 42 and one or both of the first and second impingement sprayers 66, 68. A return line 96 can be at least partially defined by the component chamber 52 and fluid outlet 44. The supply line 94 and return line 96 can at least partially form the liquid coolant circuit 92. In this manner, the housing 12 can provide for at least double-sided liquid impingement cooling of the POL module 14 inserted therein.

It is also contemplated that, in one possible implementation, the liquid coolant 90 can be recirculated between the return line 96 and supply line 94. In the illustrated example, the liquid coolant 90 can be drawn from a reservoir 91 by a pump 93. The pump 93 can direct the liquid coolant 90 to the supply line 94 for impingement cooling of the POL module 14. The return line 96 can direct the liquid coolant 90 out of the housing 12 to a heat exchanger 95 or other cooling mechanism for removing excess heat contained in the coolant from the POL module 14. The reduced-temperature liquid coolant 90 can then be directed back to the supply line 94 for further or continued impingement cooling of the POL module 14 within the housing 12. The reservoir 91, pump 93, and heat exchanger 95 are illustrated along a common portion of the liquid coolant circuit 92 for visual clarity. It will be understood that the liquid coolant circuit 92 can include other portions, branches, or the like, as well as other components such as valves, switches, or the like, as is known in the art.

Figure 4:
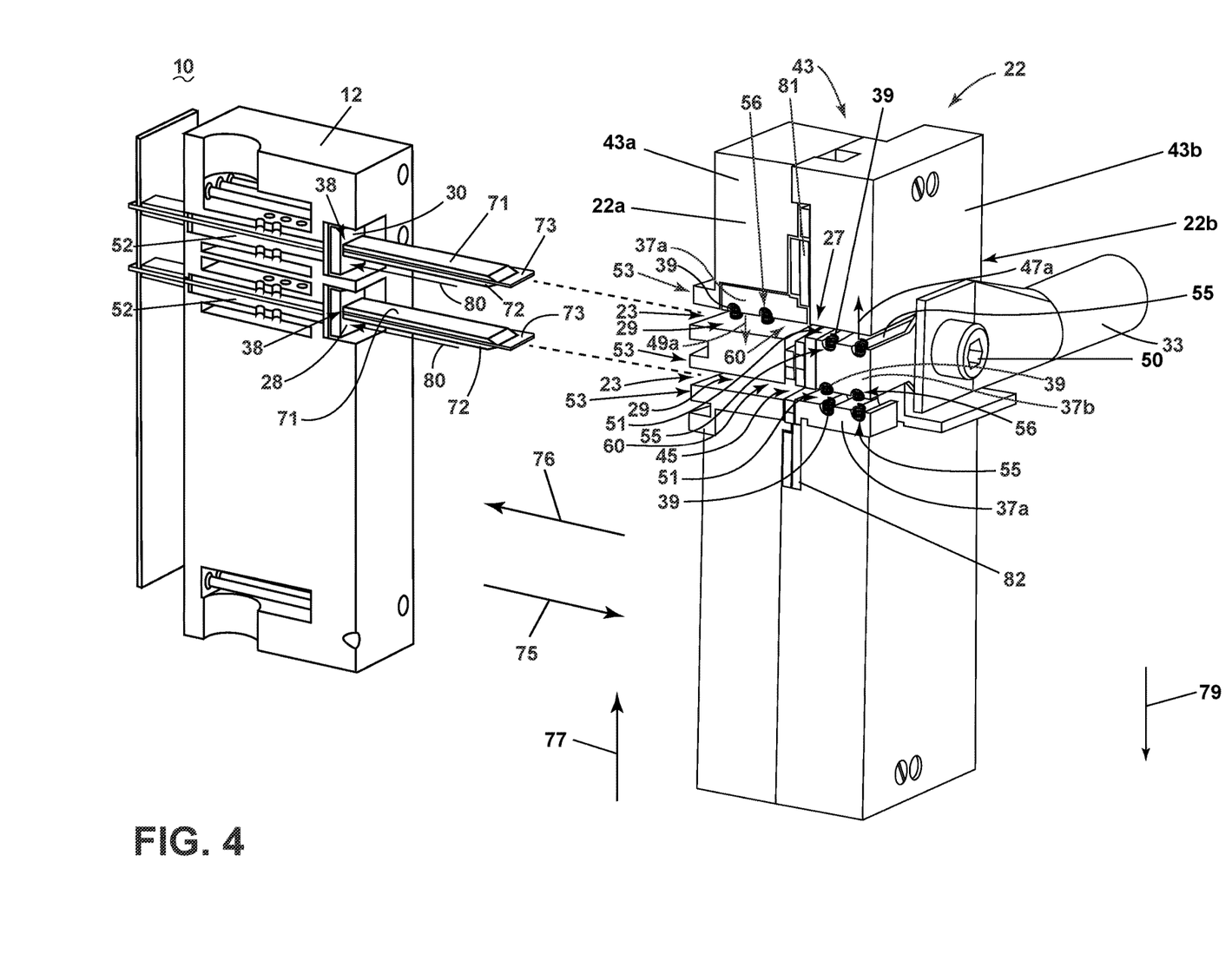
FIG. 4 is a perspective view of a connection assembly for an electronic component in accordance with various aspects described herein.

FIG. 4 depicts in partial cross-section, another exemplary aspect of the connection assembly 10. In this instance, the housing 12, contains a pair of POL modules 14 (i.e., a first POL module 14 and a second POL module 14) disposed in respective component chambers 52. Each POL module 14 includes respective first and second conductive members 71, 72 extending through the first slot 38 therefrom. As depicted, in non-limited aspects, the first and second conductive members 71, 72 can each extend through a respective first slot 38. The support assembly 22 can comprise the insulative base 43 having a set of support channels 60 defined therethrough, sized and disposed to receive a respective first conductive member 71 and second conductive member 72. The support assembly 22 can include a set of first contact members 37*a*, and a set of second contact members 37*b*. In non-limiting aspects, the set of first contact members 37*a* can be associated with a DC electrical circuit (not shown) to define a set of DC contact members 37*a*, while the set of second contact members 37*b* can be associated with an AC electrical circuit (not shown) to define a set of AC contact members 37*b*. In non-limiting aspects, the set of DC contact members 37*a* and the set of AC contact members 37*b*, can be supportably retained by the insulative base 43. A set of biasing members 39 can be arranged to cooperate with a respective DC contact member 37*a* or respective AC contact member 37*b* to electrically couple the DC contact member 37*a* or AC contact member 37*b* to a respective first conductive member 71 or second conductive member 72. An electrically conductive first DC bus member 81 and an electrically conductive second DC bus member 82 can be electrically coupled to a respective DC contact member 37*a*. In some aspects, the first and second DC bus members 81, 82 can be disposed within insulative base 43. The set of AC contact members 37*b* can be arranged to be electrically coupled to a respective AC output conductor 33 (e.g., a single-phase AC output conductor).

The support assembly 22 can comprise the input portion 22*a*, and the output portion 22*b*. The input portion 22*a* can comprise the first insulative base 43*a*, and the output portion 22*b* can comprise the second insulative base 43*b*. A set of first channels 29 can be defined through the first insulative base 43*a*, and a corresponding set of second channels 51 can be defined through the second insulative base 43*b*. In non-limiting aspects, each first channel 29 can be in registry or aligned with a corresponding second channel 51 to cooperatively define a respective support channel 60 through the support assembly 22. Each first channel 29 and corresponding second channel 51 can be sized and disposed to insertably receive a respective first conductive member 71 and second conductive member 72 therethrough.

In non-limiting aspects, the DC contact members 37*a* and AC contact members 37*b* can be formed of copper or other electrically conductive material. The DC contact members 37*a* and AC contact members 37*b* can be fixedly secured within one of the first insulative base 43*a* and the second insulative base 43*b*. The DC contact members 37*a* and AC contact members 37b are arranged to slidingly receive a respective one of the first conductive member 71 and second conductive member 72 within a respective channel 60, to thereby electrically couple the respective first conductive member 71 and second conductive member 72 to a respective one of the DC contact members 37a or AC contact members 37b. A respective biasing member 39 can cooperate with the respective DC contact member 37a or respective AC contact member 37b to increase a contact force between the DC contact member 37a or AC contact member 37b and the respective first conductive member 71 or second conductive member 72. The DC contact members 37a can be electrically coupled to a respective one of the first DC bus member 81 and the second DC bus member 82. The AC contact members 37b can be electrically coupled (e.g., fastened) to respective AC output conductors 33 via a respective bolt 50. The bolt 50 can extend through an aperture (not shown) defined through the second insulative base 43b.

In non-limiting aspects, the biasing members 39 can be spring elements such as leaf springs or coil springs. In some non-limiting aspects, the biasing members 39 can be formed of copper, steel, or other conductive material. In other non-limiting aspects, the biasing members 39 can be formed of a non-conductive material.

In non-limiting aspects, one or more of the biasing members 39 can cooperate with a respective DC contact members 37a or respective AC contact member 37b to impart or apply a first force 47a in a third direction 77 (e.g., an upward direction). Additionally, one or more of the biasing members 39 can cooperate with a respective DC contact member 37a or respective AC contact member 37b to apply a second force 49a in a fourth direction 79 (e.g., a downward direction).

The input portion 22a can define a set of first output apertures 45 defined therethrough, corresponding to each first input aperture 23. Each first channel 29 can be in registry with, and extend between, a corresponding first input aperture 23 and first output aperture 45. Each first channel 29 and corresponding first input aperture 23 and first output aperture 45 can correspond to a respective first conductive member 71 and second conductive member 72. Each first channel 29 and corresponding first input aperture 23 and first output aperture 45 can be sized and arranged to cooperatively receive the respective first conductive member 71 and second conductive member 72 therethrough in the first direction 75. For example, the first insulative base 43a can have the set of first channels 29 defined therethrough, extending between the first input aperture 23 and first output aperture 45, and sized to operatively receive a respective first conductive member 71 and second conductive member 72 therethrough.

The output portion 22b of the support assembly 22 can define the set of second input apertures 27 (see FIG. 1), and the corresponding second channels 51. Each second channel 51 can be in registry with a corresponding second input aperture 27. In non-limiting aspects, each second channel 51 can be in at least partial registry with the respective contact member 37. Each second channel 51 and second input aperture 27 can correspond to a respective first conductive member 71 and second conductive member 72. Each second channel 51 and second input aperture 27, can be sized and arranged to cooperatively receive the respective first conductive member 71 and second conductive member 72 therethrough in the first direction 75.

For example, the second insulative base 43b can have the set of second channels 51 defined therethrough, and sized to operatively receive the respective first conductive member 71 and second conductive member 72 therein to enable an electrical connection between the respective first conductive member 71 or second conductive member 72 and one or more respective DC contact member 37a and AC contact members 37b.

In non-limiting aspects, each first channel 29 can be in registry or aligned with a corresponding second channel 51 to cooperatively define a respective support channel 60. In non-limiting aspects, each respective first conductive member 71 and second conductive member 72 can be supported by at least one of a respective DC contact member 37a, an AC contact member 37b, and a respective biasing member 39 disposed in the support channel 60.

In non-limiting aspects, the support assembly 22 can be further advantageously arranged to operatively provide a sealing force 80 to the sealing elements 28 (e.g., seals 30). For example, the housing interface surface 21 (see FIG. 1) of the first insulative base 43a can define one or more sealing surfaces 53. In non-limiting aspects, the sealing surfaces 53 can be defined by protrusions 53a on opposite sides of the channel 60. The sealing surfaces 53 can be configured to be received in the first slot 38 on each side of the first and second conductive members 71, 72. The sealing surfaces 53 can be disposed to register or engage with a corresponding first seal 30 of the housing 12 when the set of first conductive members 71 are fully inserted into the support assembly 22. The sealing surfaces 53 can operatively apply a sealing force 80 to a respective first seal 30 in the second direction 76. As illustrated, in some aspects, the second direction 76 can be an inward direction with respect to the housing 12. In non-limiting aspects, at least one of the third direction 77 and fourth direction 79 can be substantially orthogonal to the second direction 76. The sealing force 80 imparted by the sealing surface 53 to the corresponding first seal 30 can provide for improved fluid sealing of the corresponding component chamber 52.

Figure 5:
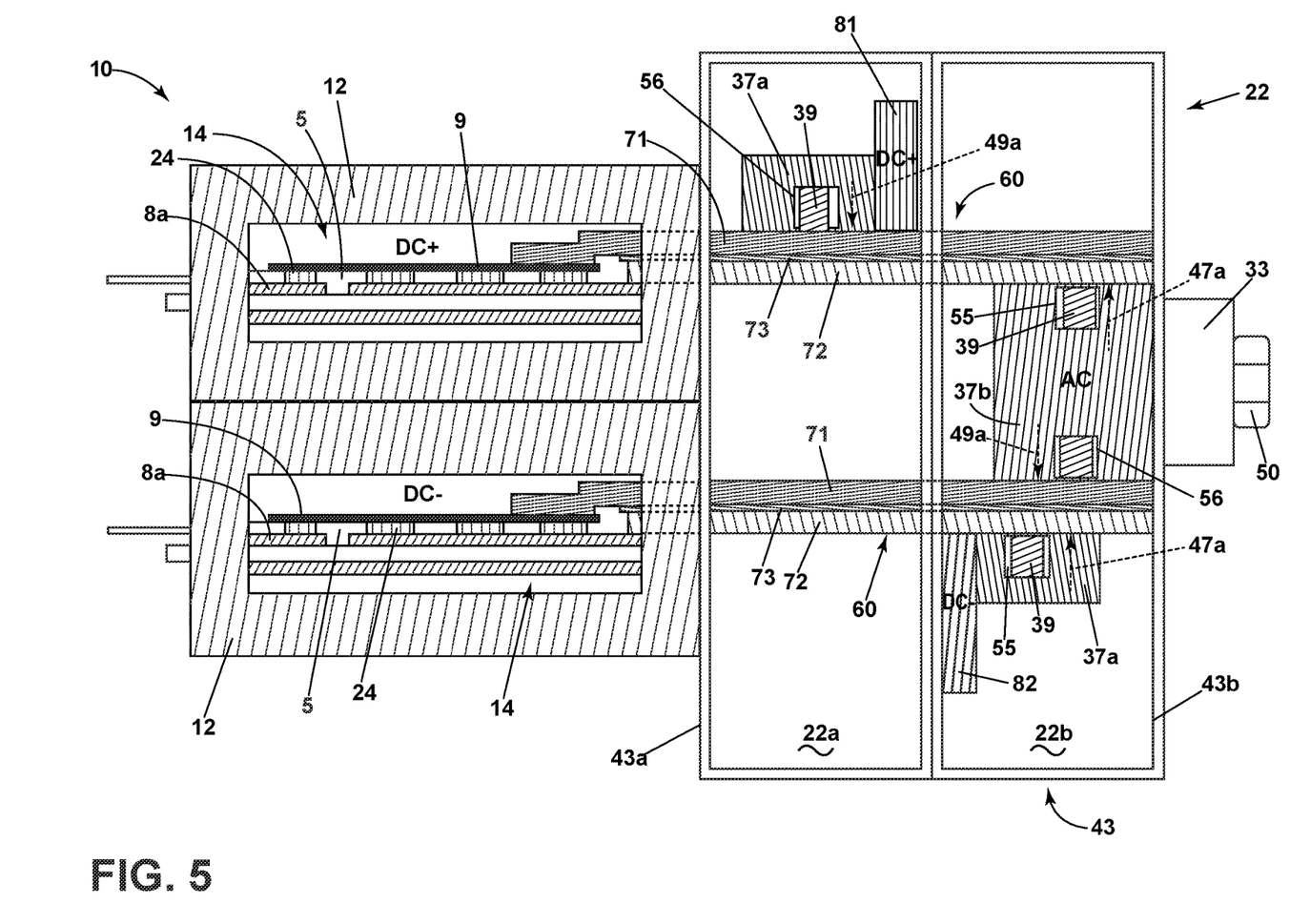
FIG. 5 is a simplified schematic cross-sectional view of another connection assembly for an electronic component in accordance with various aspects described herein.

FIG. 5 illustrates in partial cross-section, a simplified schematic depiction another non-limiting aspect of the connection assembly 10, with the pair of first and second conductive members 71, 72 inserted into the respective support channels 60 defined in the base 43. One notable difference between the connection assembly of FIG. 5 and that shown in FIG. 4 is that the example of FIG. 5 does not include the sealing elements 28 or liquid coolant 90. As shown, the housing 12 partially encloses the respective POL modules 14 disposed therein, with the respective first and second conductive members 71, 72 extending therefrom. Each of the pair of first and second conductive members 71, 72 are insertably received at their respective second ends within the respective support channels 60 defined within the insulative base 43. As support shown, for each respective POL module 14, the respective first conductive member 71 can be electrically coupled to one of the top conductive layer 9 or the conductive first layer 8a of the respective substrate 8, and the respective second conductive member 72 can be electrically coupled to the other of the top conductive layer 9 or the conductive first layer 8a of the respective substrate 8.

The first DC bus member 81 can be coupled to DC power source (not shown), such as a bus battery, DC-DC converter, or other power source disposed at an exterior of the insulative base 43, to receive a positive DC voltage V+ therefrom. Likewise, in non-limiting aspects, the second DC bus member 82 can be coupled to the DC power source (not shown), such as a bus battery, DC-DC converter, or other power source disposed at an exterior of the insulative base 43, to receive a negative DC voltage V– therefrom. In non-limiting aspects, first DC bus member 81 can be electrically coupled to a respective DC contact member 37a, and the second DC bus member 82 can be electrically coupled to another respective DC contact member 37a. The set of AC contact members 37b can be coupleable to a corresponding AC output conductor 33.

As shown, the DC contact members 37a and AC contact members 37b can be electrically coupled to a respective one of the first conductive members 71 and second conductive members 72. In non-limiting aspects, each first and second conductive member 71, 72 can be supported by a respective one of a DC contact member 37a or AC contact member 37b, disposed in the insulative base 43. For instance, in non-limiting aspect illustrated in FIG. 5, the topmost first conductive member 71 protruding from the of the housing 12 (i.e., at the upper portion of the housing 12 when viewing the Figure) is shown electrically coupled to the topmost DC contact member 37a, thereby electrically coupling the topmost first conductive member 71 to the first DC bust member 81. Additionally, the topmost second conductive member 72 protruding from the housing 12 (i.e., at the upper portion of the housing 12 when viewing the Figure) is shown electrically coupled to the AC contact member 37b, thereby electrically coupling the topmost second conductive member 72 to the AC output conductor 33. Additionally, as depicted in FIG. 5, the other, or bottommost, first conductive member 71 protruding from the housing 12 is shown electrically coupled to the AC contact member 37b thereby electrically coupling the bottommost first conductive member 71 to the AC output conductor 33. Additionally, the other, or bottommost, second conductive member 72 protruding from the lower housing 12 is shown electrically coupled to the bottommost DC contact member 37a, thereby electrically coupling the bottommost second conductive member 72 to the second DC bus member 82.

In non-limiting aspects, one or more of the biasing members 39 can cooperate with a respective DC contact member 37a or AC contact member 37b impart or apply the first force 47a in the third direction 77 (e.g., an upward direction) to a respective first conductive member 71 or second conductive member 72. Additionally, another of the biasing members 39 can cooperate with another respective DC contact member 37a or AC contact member 37b, to apply a second force 49a in a fourth direction 79 (e.g., a downward direction) to the respective first conductive member 71 or second conductive member 72. In some aspects, the first force 47a and second force 49a imparted by the respective biasing members 39, act to releasably retain the respective first conductive member 71 or second conductive member 72 within the support assembly 22. In some aspects, the first force 47a and second force can further act to increase a contact pressure between the respective first conductive member 71 or second contact member 72, and the corresponding DC contact member 37a or AC contact member 37b.

In non-limiting aspects, the biasing members 39 can be supported or retained by a respective DC contact member 37a or an AC contact member 37b. For example, in non-limiting aspects a respective notch or first groove 55 can be defined in a respective DC contact member 37a, a respective AC contact member 37b, or both. The first groove 55 can be sized to receive a respective biasing member 39. Similarly, a respective second groove 56 can be defined in a respective DC contact member 37a, a respective AC contact member 37b, or both. The second groove 56 can be sized to receive a respective biasing member 39. The biasing member 39 disposed in a respective first groove 55 can be arranged to apply the first force 47a to a respective first conductive member 71 or second conductive member 72 in the third direction 77. The respective biasing member 39 disposed in a second groove 56 can be arranged to apply the second force 49a to a respective first conductive member 71 or second conductive member 72 in the fourth direction 79. In aspects, the third direction 77 can be opposite the fourth direction 79, such that the second force 49a opposes the first force 47a. The first force 47a and second force 49a can be of respective predetermined magnitudes to result in an increase in contact pressure between the respective first conductive members 71 or second conductive members 72, and the corresponding DC contact member 37a, or AC contact member 37b.

It will be appreciated that an increase in a contact pressure between the first conductive members 71 or second conductive members 72, and the corresponding DC contact member 37a or AC contact member 37b will reduce an electrical resistance therebetween, and consequently result in reduced heating in response to a current flow through the respective first conductive member 71 or second conductive member 72. Additionally, or alternatively, the first force 47a and second force 49a can be of predetermined respective magnitudes to result in an increased retention of the respective first conductive member 71 or second conductive member 72 within the support assembly 22. In non-limiting aspects, the first force 47a and the second force 49a can be substantially equal. In other aspects, the first force 47a and second force 49a can each comprise any desired magnitude without departing from the scope of the disclosure herein.

Figure 6:
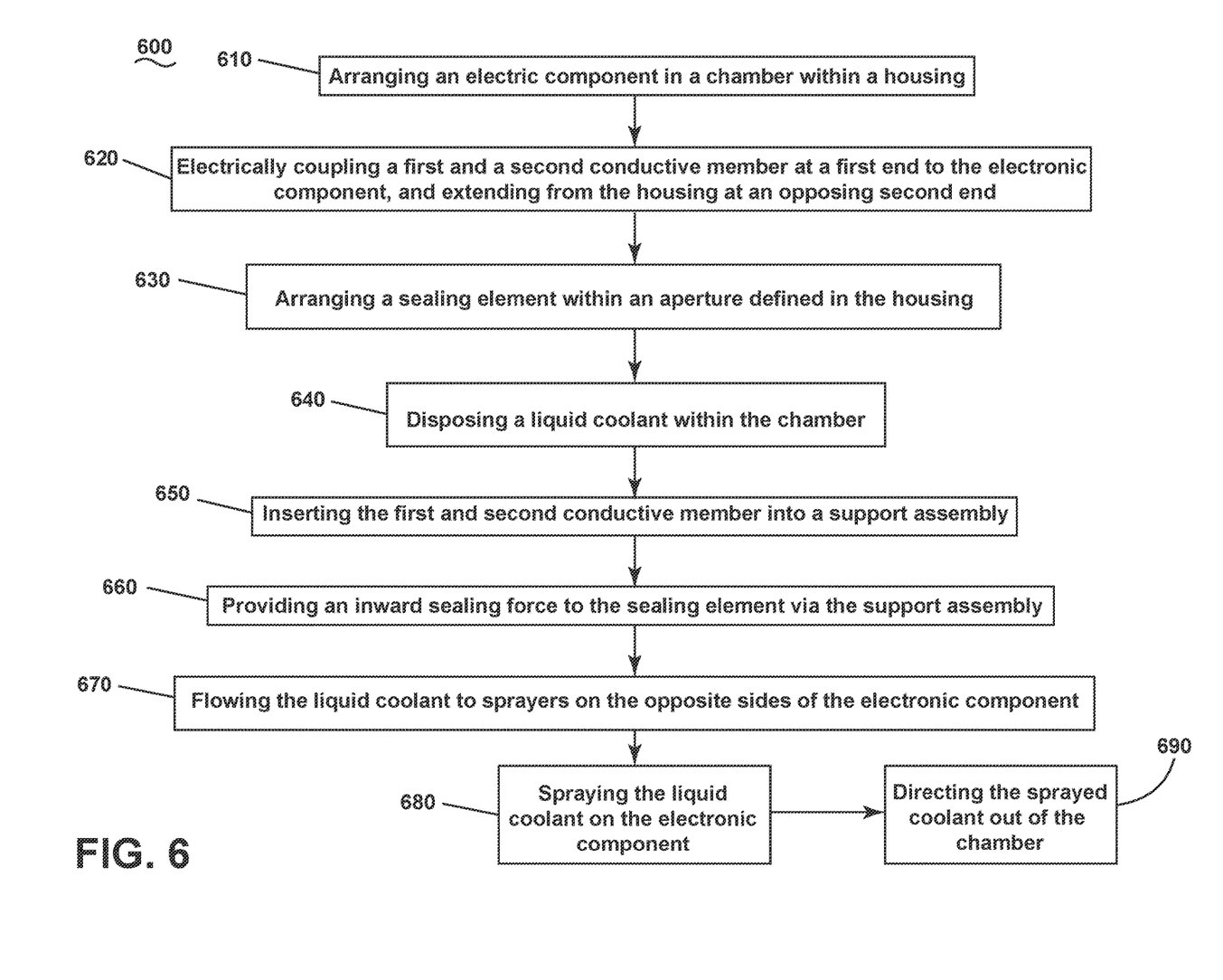
FIG. 6 is a flow diagram of a method of cooling an electronic component in accordance with various aspects described herein.

FIG. 6 illustrates a non-limiting aspect of a method 600 of cooling an electronic component 14 having a set of electrical devices 24 coupled to a substrate 19. In non-limiting aspects, the electronic component 14 can comprise a POL module 14. For ease of understanding and description, the method 600 will be described with reference to the non-limiting aspects as disclosed herein and depicted in FIGS. 1-4.

The method 600 can begin, at step 610, by arranging POL module 14 within a component chamber 52 defined within the housing 12 having an interior portion 36 and an exterior portion 41. In non-limiting aspects, the housing 12 can include the outer wall 57 bounding the interior portion 36. The outer wall 57 can also define the exterior portion 41. The interior portion 36 can define the component chamber 52. The housing 12 can further define the aperture or first slot 38 defined through the outer wall 57 extending to the interior portion 36. In an aspect, the first slot 38 can extend from the exterior portion 41 through the outer wall 57 to the interior portion 36. The POL module 14 can be placed into the component chamber 52 by inserting the POL module 14 through the first slot 38 in a first direction 75. Each POL module 14 can extend from a respective first end 16 (e.g., an output end) to a respective second end 18 (e.g., an input end). In non-limiting aspects, the first end 16 can define a conductive member portion 70 extending from the housing 12, while the second end 18 can define an electrical devices portion 69 received within the housing 12. The conductive member portion 70 can comprise a first conductive member 71 and a second conductive member 72. In non-limiting aspects, a portion of the POL module 14 conductive member portion 70 can protrude from the housing 12. For example, the first conductive member 71 and the second conductive member 72 extend from the first slot 38 with an insulating layer 73 disposed between the first and second conductive members 71, 72. In non-limiting aspects, the electrical devices portion 69 can be received within the interior portion 36.

At step 620, the first conductive member 71 and the second conductive member 72 can be electrically coupled at a respective second end 18 to the POL module 14. The first and second conductive members 71, 72 can extend through the first slot 38 to the exterior portion 41 of the housing 12 at a respective opposing first end 16. For example, in non-limiting aspects, the POL module 14 can be inserted into the housing 12 through the first slot 38. The first and second conductive members 71, 72 can be positioned having their respective second ends 18 at least partially within interior portion 36 of the housing 12, and extending from the housing 12 in the second direction 76, for example, with their respective first ends 16 extending through the first slot 38 from the housing 12 to the exterior portion 41. In non-limiting aspects, the first slot 38 can surround the first conductive member 71 and second conductive member 72. In non-limiting aspects, the housing 12 can define the first sealing surface 31a surrounding the first slot 38. Additionally, or alternatively, the housing 12 can define the second sealing surface 31b surrounding the first slot 38. For example, the first sealing surface 31a and second sealing surface 31b can be arranged orthogonal to each other.

The method can include at step 630, arranging the seal 30 of sealing element 28 within the first slot 38 to fluidly seal the component chamber 52. For example, the seal 30 of sealing element 28 can be arranged to surround a portion of the POL module 14 to form a seal between the POL module 14 and at least one of the first sealing surface 31a and second sealing surface 31b. Additionally, or alternatively, the seals 30 of sealing element 28 can be sealingly coupled to either or both of the housing 12 or the POL module 14. For example, the seal 30 of sealing element 28 can be arranged to sealingly engage the first sealing surface 31a, and the second sealing surface 31b. In non-limiting aspects, the sealing element 28 can include the first seal 30 and the second seal 32. The first seal 30 can be disposed proximate the first end 16 and the second seal 32 can be disposed proximate the second end 18. The sealing element 28 can at least partially surround a portion of the first conductive member 71 and second conductive member 72 and fluidly seal the component chamber 52.

It is contemplated that during an operation of the POL module 14, heat can be generated by the set of electrical devices 24. The method can continue at step 640, by disposing the liquid coolant 90 within the component chamber 52 to cool the electrical devices 24. The liquid coolant 90 can be in thermal communication with the POL module 14. For example, in non-limiting aspects, the liquid coolant 90 can be in thermal communication with one or more of the electrical devices 24. In non-limiting aspects, the liquid coolant 90 can comprise water, water-ethylene glycol, oil, or dielectric fluid.

The method 600 can include, at step 650, inserting the first end 16 of the first and second conductive members 71, 72 into the support assembly 22. The support assembly 22 can include an electrically insulative base 43 couplable to the housing 12. The insulative base 43 can define the set of support channels 60 therein. Each support channel 60 can be configured to receive a respective first end 16 of the first and second conductive member 71, 72. For example, the set of first channels 29 can be defined through the first insulative base 43a, and the corresponding set of second channels 51 can be defined through the second insulative base 43b. Each first channel 29 can be aligned or in registration with the corresponding second channel 51 to thereby cooperatively define a respective support channel 60.

The support assembly 22 can include the set of conductive DC contact members 37a and a set of AC contact members 37b supported by the insulative base 43. Each DC contact members 37a and AC contact members 37b can be disposed to be electrically coupled to a respective first conductive member 71 or second conductive member 72. In non-limiting aspects, the set of biasing members 39 can be supported by the insulative base 43. For example, each first biasing member 39, can be coupled to a respective DC contact member 37a or AC contact member 37b. The first biasing members 39 can be arranged to operatively apply the first force 47a to a first conductive member 71 in the third direction 77. Additionally, the second biasing member 39 can be arranged to operatively apply the second force 49a to the second conductive member first end 16 in the fourth direction 79. In aspects, the fourth direction 79 can be opposite the third direction 77. In non-limiting aspects, at least one of the third direction 77 and fourth direction 79 can be substantially orthogonal to the second direction 76. In non-limiting aspects, the magnitude of the first force 47a can be substantially equal to the magnitude of the second force 49a.

The method can include, at step 660, providing or applying the sealing force 80 to the sealing element 28 (e.g., seal 30) via the support assembly 22. For example, the base 43 can define the sealing surface 53 arranged to operatively engage the seal 30 of sealing element 28 and apply the sealing force 80 thereto. In non-limiting aspects, the sealing force 80 can be applied in the second direction 76. In some aspects, the second direction 76 can be substantially orthogonal to the third direction 77 or the fourth direction 79, or both.

The method can include, at step 670, flowing the liquid coolant 90 through a supply line to first and second impingement sprayers 66, 68 located on opposite sides of the electronic component 14; and, at step 680 spraying or emitting an impinging spray of the liquid coolant 90 from the first and second impingement sprayers 66, 68 onto at least two opposite surfaces of the electronic component 14 within the component chamber 52. The method can further include, at step 690 directing the sprayed liquid coolant out of the component chamber 52 through the return line fluidly coupled to the component chamber 52.

The sequence depicted is for illustrative purposes only and is not meant to limit the method 600 in any way as it is understood that the steps or portions of the method can proceed in a different logical order, additional or intervening portions can be included, or described portions of the method can be divided into multiple portions, or described portions of the method can be omitted without detracting from the described method.

Aspects of the disclosure provide for a variety of benefits. The liquid-cooled assemblies described herein can include replaceable building blocks or modules having a substantially similar underlying form factor (e.g. footprint, or common connections), that can provide low-cost manufacturability and interactive placement for a POL module assembly or other power module assembly. Common or reusable form factors can further result in higher process or manufacturing yields, and different module configuration without significant design changes. In addition, the assembly described provides for improved repairability, as a given power overlay module can be easily removed, replaced, or serviced as needed. The sealed, modular housing provides for a compact, ultra-high-power density assembly of multiple devices into a power electronics system. The housing design described herein allows for replaceable or permanently installed and sealed power electronics devices.

The use of direct liquid impingement or spray provides for improved cooling of the power overlay modules compared to traditional designs utilizing heat spreaders, conductive plates, or the like. Multiple sides of the power overlay modules can be simultaneously cooled by direct liquid contact, including on opposing sides of the modules, thereby reducing cooling time and improving performance of the power overlay assembly. In examples where a dielectric coating is utilized with the module surface, the power overlay module design further allows for the use of non-insulating cooling fluids (e.g. water) having better cooling performance compared to insulating fluids (e.g. oil), including in examples where an insulating coating is provided over the POL modules.

More compact and efficient cooling approaches are needed for future designs of power electronics systems with higher power densities. Direct contact, forced convection cooling on dual sides of a power electronics device provides for more efficient heat extraction on shorter timescales compared to traditional methods. Forced convection by way of jet impingement or spray further enhances this heat extraction with locally-higher heat transfer coefficients that may be targeted directly opposite each of the internal heat generating components. The sealed and modular housing as described herein allows for higher power density, three-dimensional configurations that are better suited to meet high power demands. Additionally, aspects as disclosed herein can additionally provide increased sealing reliability by providing structure to impart additional sealing forces on the sealing elements of the sealed modular housing than traditional methods.

Many other possible aspects and configurations in addition to that shown in the above figures are contemplated by the present disclosure.

To the extent not already described, the different features and structures of the various aspects can be used in combination with each other as desired. That one feature is not illustrated in all of the aspects is not meant to be construed that it is not included, but is done for brevity of description. Thus, the various features of the different aspects can be mixed and matched as desired to form new aspects of the disclosure, whether or not the new aspects are expressly described. All combinations or permutations of features described herein are covered by this disclosure.

This written description uses examples to disclose aspects of the disclosure, including the best mode, and also to enable any person skilled in the art to practice the aspects of the disclosure, including making and using any devices or systems and performing any incorporated methods. The patentable scope of the disclosure is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

Various characteristics, aspects and advantages of the present disclosure may also be embodied in any permutation of aspects of the disclosure, including but not limited to the following technical solutions as defined in the enumerated aspects:

1. A connection assembly (10) comprising: an electronic component (14) comprising a conductive member portion (70) at a first end (16) of the electronic component (14) and an electrical devices portion (69) at a second end (18) of the electronic component (14), the conductive member portion (70) comprising: a first conductive member (71); and a second conductive member (72); a housing (12) defining an interior portion (36), wherein the electrical devices portion (69) is received in the interior portion (36) and the conductive member portion (70) extends from the housing (12); a support assembly (22) configured to couple to the housing (12), the support assembly (22) comprising: a channel (60) configured to receive the conductive member portion (70) extending from the housing (12), the channel (60) comprising: a first contact member (37a) that is configured to electrically couple to the first conductive member (71) when the conductive member portion (70) is received in the channel (60); and a second contact member (37b) that is configured to electrically couple to the second conductive member (72) when the conductive member portion (70) is received in the channel (60).

2. The connection assembly (10) of any preceding clause, wherein the electrical devices portion (69) comprises a top conductive layer (9), and a conductive substrate (8).

3. The connection assembly (10) of any preceding clause, further comprising a sealing element (28) including a first seal (30), where the first seal (30) is configured to seal the electrical devices portion (69) in the housing (12).

4. The connection assembly (10) of any preceding clause, wherein the first seal (30) is disposed between the support assembly (22) and the housing (12) when the support assembly (22) is coupled to the housing (12).

5. The connection assembly (10) of any preceding clause, wherein the first seal (30) is configured to close a first slot (38).

6. The connection assembly (10) of any preceding clause, wherein the sealing element (28) further includes a second seal (32), wherein the electrical devices portion (69) is between the first seal (30) and the second seal (32).

7. The connection assembly (10) of any preceding clause, wherein the first seal (30) is disposed between the support assembly (22) and the housing (12) when the support assembly (22) is coupled to the housing (12).

8. The connection assembly (10) of any preceding clause, wherein the support assembly (22) is electrically insulative.

9. The connection assembly (10) of any preceding clause, further comprising a liquid coolant (90) within the housing (12) interior portion (36).

10. The connection assembly (10) of any preceding clause, further comprising: a first biasing member (39) supported by the support assembly (22), arranged to apply a first force (47a) to the first conductive member (71) in a first direction (77) when the conductive member portion (70) is received in the channel (60); and a second biasing member supported by the support assembly (22), arranged to apply a second force (49a) to the second conductive member (72) in a second direction (79) when the conductive member portion (70) is received in the channel (60).

11. The connection assembly (10) of any preceding clause, wherein the first contact member (37a) is an AC contact member, and the second contact member (37b) is a DC contact member.

12. The connection assembly (10) of any preceding clause, wherein the conductive member portion (70) is a substrate, the first conductive member (71) is a first layer of the substrate, the second conductive member (72) is a second layer of the substrate, and the first conductive member (71) and the second conductive member (72) are separated by an insulating layer of the substrate.

13. The connection assembly (10) of any preceding clause, further comprising a set of electronic components (14) each having a respective interior portion (36) disposed in housing (12) and a respective conductive member portion (70) at the second end (18) that extends from the housing (12); and wherein the support assembly (22) further comprises a set of channels (60) configured to receive a respective conductive member portion (70).

14. A support assembly (22) configured to couple to a housing (12), the support assembly (22) comprising: a channel (60) configured to receive a conductive member portion (70) extending from the housing (12), the channel (60) comprising: a first contact member (37a) configured to electrically couple to the first conductive member (71) when the conductive member portion (70) is received in the channel (60); and a second contact member (37b) that is configured to electrically couple to the second conductive member (72) when the conductive member portion (70) is received in the channel (60).

15. The support assembly (22) of any preceding clause, wherein the support assembly (22) is electrically insulative.

16. The support assembly (22) of any preceding clause, wherein the support assembly (22) further comprises protrusions (53a) on opposite sides of the channel (60).

17. The support assembly (22) of any preceding clause, wherein the protrusions (53a) are configured to be received a first slot (38) defined in the housing (12) on each side of the conductive member portion (70).

18. The support assembly (22) of any preceding clause, further comprising:
a first biasing member (39) supported by the insulative base, arranged to apply a first force (47a) to the first conductive member (71) in a first direction (77) when the conductive member portion (70) is received in the channel (60); and a second biasing member supported by the insulative base, arranged to apply a second force (49a) to the second conductive member (72) in a second direction (79) when the conductive member portion (70) is received in the channel (60).

19. The support assembly (22) of any preceding clause, wherein the first contact member (37a) is an AC contact member, second contact member (37b) is a DC contact member.

20. The support assembly (22) of any preceding clause, wherein a set of electronic components (14) are disposed in the housing (12) each having a respective conductive member portion (70) that extend from the housing (12); and wherein the support assembly (22) further comprises a set of channels (60) configured to receive a respective conductive member portion (70).

21. A method (600) of cooling an electronic component (14), the method (600) comprising: arranging the electronic component (14) within a chamber (52) defined within a housing (12) having an interior portion (36) and an exterior portion (41), the interior portion (36) defining the component chamber, the housing (12) further defining at least one slot (38) therethrough extending from the exterior portion (41) to the interior portion (36); electrically coupling a first conductive member (71) at a respective first end (16) to the electronic component (14), and extending through the at least one slot (38) to the exterior portion (41) of the housing (12) at an opposing second end (18); electrically coupling a second conductive member (72) at a respective first end (16) to the first electronic component (14), and extending through the at least one slot (38) to an exterior of the housing (12) at an opposing second end (18); inserting the first and second conductive members (71), (72) into a support assembly (22), the support assembly (22) comprising: an electrically insulative base (43) couplable to the exterior portion (41) of the housing (12), the electrically insulative base (43) defining a channel (60) therein configured to insertably receive the first and second conductive members (71), (72) therethrough; a first contact member (37a) supported by the insulative base (43) and electrically couplable to the first conductive member (43); a second contact member (37b) supported by the insulative base (43) electrically and couplable to the second end (18) of the second conductive member (72); a first biasing member (39) supported by the insulative base (43), arranged apply a first force (47a) to the first conductive member (71) in a first direction (77); and a second biasing member (39) supported by the insulative base (43) arranged to apply a second force (49a) to the second conductive member (72) second end (18) in a second direction (79).

22. The method of any preceding clause, further comprising: disposing a liquid coolant (90) within the component chamber in thermal communication with the electronic component (14); arranging a sealing element (28) within the at least one slot (38) to fluidly seal the component chamber; and providing a sealing force (80) to the sealing element (28) via the electrically insulative base (43).

What is claimed is:
1. A connection assembly comprising:
an electronic component comprising a conductive member portion at a first end of the electronic component and an electrical devices portion at a second end of the first electronic component, the conductive member portion comprising:
a first conductive member; and
a second conductive member;
a housing defining an interior portion, wherein the electrical devices portion is received in the interior portion and the conductive member portion extends from the housing;
a support assembly configured to couple to the housing, the support assembly comprising:
a channel configured to receive the conductive member portion extending from the housing, the channel comprising:
a first contact member that is configured to electrically couple to the first conductive member when the conductive member portion is received in the channel; and
a second contact member that is configured to electrically couple to the second conductive member when the conductive member portion is received in the channel.

2. The connection assembly of claim 1, wherein the electrical devices portion comprises a top conductive layer, and a conductive substrate.

3. The connection assembly of claim 1, wherein the support assembly is electrically insulative.

4. The connection assembly of claim 1, further comprising a liquid coolant within the housing interior portion.

5. The connection assembly of claim 1, further comprising:
a first biasing member supported by the support assembly, arranged to apply a first force to the first conductive member in a first direction when the conductive member portion is received in the channel; and
a second biasing member supported by the support assembly, arranged to apply a second force to the second conductive member in a second direction when the conductive member portion is received in the channel.

6. The connection assembly of claim 1, wherein the first contact member is an AC contact member, and the second contact member is a DC contact member.

7. The connection assembly of claim 1, wherein the conductive member portion is a substrate, the first conductive member is a first layer of the substrate, the second conductive member is a second layer of the substrate, and the first conductive member and the second conductive member are separated by an insulating layer of the substrate.

8. The connection assembly of claim 1, further comprising a set of electronic components each having a respective interior portion disposed in housing and a respective conductive member portion at the second end that extends from the housing; and
   wherein the support assembly further comprises a set of channels configured to receive a respective conductive member portion.

9. The connection assembly of claim 1, further comprising a sealing element including a first seal, where the first seal is configured to seal the electrical devices portion in the housing.

10. The connection assembly of claim 9, wherein the first seal is disposed between the support assembly and the housing when the support assembly is coupled to the housing.

11. The connection assembly of claim 10, wherein the first seal is configured to close a first slot.

12. The connection assembly of claim 9, wherein the sealing element further includes a second seal, wherein the electrical devices portion is between the first seal and the second seal.

13. The connection assembly of claim 12, wherein the first seal is disposed between the support assembly and the housing when the support assembly is coupled to the housing.

14. A support assembly configured to couple to a housing, the support assembly comprising:
   a channel configured to receive a conductive member portion extending from the housing, the channel comprising:
      a first contact member configured to electrically couple to the first conductive member when the conductive member portion is received in the channel; and
      a second contact member configured to electrically couple to the second conductive member when the conductive member portion is received in the channel.

15. The support assembly of claim 14, wherein the support assembly is electrically insulative.

16. The support assembly of claim 14, further comprising:
   a first biasing member supported by the insulative base, arranged to apply a first force to the first conductive member in a first direction when the conductive member portion is received in the channel; and
   a second biasing member supported by the insulative base, arranged to apply a second force to the second conductive member in a second direction when the conductive member portion is received in the channel.

17. The support assembly of claim 14, wherein the first contact member is an AC contact member, and the second contact member is a DC contact member.

18. The support assembly of claim 14, wherein a set of electronic components are disposed in the housing each having a respective conductive member portion that extends from the housing; and wherein the support assembly further comprises a set of channels configured to receive a respective conductive member portion.

19. The support assembly of claim 14, wherein the support assembly further comprises protrusions on opposite sides of the channel.

20. The support assembly of claim 19, wherein the protrusions are configured to be received a first slot defined in the housing on each side of the conductive member portion.

* * * * *

UNITED STATES PATENT AND TRADEMARK OFFICE
CERTIFICATE OF CORRECTION

PATENT NO. : 12,322,916 B2
APPLICATION NO. : 17/846711
DATED : June 3, 2025
INVENTOR(S) : Kapusta et al.

Page 1 of 1

It is certified that error appears in the above-identified patent and that said Letters Patent is hereby corrected as shown below:

In the Claims

In Column 24, Claim 20, Line 34, delete "to be received" and insert -- to be received in --, therefor.

Signed and Sealed this
Twenty-sixth Day of August, 2025

Coke Morgan Stewart
*Acting Director of the United States Patent and Trademark Office*